United States Patent
Kim et al.

(10) Patent No.: US 9,091,716 B2
(45) Date of Patent: Jul. 28, 2015

(54) METHOD AND APPARATUS FOR MEASURING PERFORMANCE OF ELECTRONIC DEVICE

(71) Applicant: Samsung Electronics Co. Ltd., Suwon-si, Gyeonggi-do (KR)

(72) Inventors: Jungmin Kim, Seongnam-si (KR); Keonyoung Seo, Seoul (KR); Kwangmo Yang, Suwon-si (KR); Byeonghwan Kang, Seongnam-si (KR); Bonghee Park, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 237 days.

(21) Appl. No.: 13/644,793

(22) Filed: Oct. 4, 2012

(65) Prior Publication Data
US 2013/0082717 A1      Apr. 4, 2013

(30) Foreign Application Priority Data

Oct. 4, 2011 (KR) ......................... 10-2011-0100801

(51) Int. Cl.
*G01R 31/00* (2006.01)
*H04M 1/24* (2006.01)

(52) U.S. Cl.
CPC .............. *G01R 31/001* (2013.01); *H04M 1/24* (2013.01)

(58) Field of Classification Search
CPC .. G01R 31/001; G01R 29/08; G01R 29/0878; G01R 29/12; G01R 29/26; G01R 31/002; G01R 33/0213; G01R 33/443
See application file for complete search history.

(56) References Cited

U.S. PATENT DOCUMENTS

| | | | |
|---|---|---|---|
| 5,514,971 A * | 5/1996 | Hankui et al. | 324/639 |
| 7,541,818 B2 * | 6/2009 | Kosaka et al. | 324/754.29 |
| 2004/0155824 A1 | 8/2004 | Nagashima | |
| 2004/0183529 A1 | 9/2004 | Kajiwara et al. | |
| 2010/0123453 A1 | 5/2010 | Pauly et al. | |

FOREIGN PATENT DOCUMENTS

| | | |
|---|---|---|
| GB | 2 403 554 A | 1/2005 |
| JP | 08-297148 A | 11/1996 |
| JP | 11-083535 A | 3/1999 |
| JP | 2004-264143 A | 9/2004 |
| JP | 2005-502860 A | 1/2005 |
| WO | 96-30774 A1 | 10/1996 |

OTHER PUBLICATIONS

Keller C et al: "Fast Emission Measurement in Time Domain", IEEE Transactions on Electromagnetic Compatibility, pp. 816-824, XP011196810, Nov. 1, 2007.

* cited by examiner

*Primary Examiner* — Tung X Nguyen
(74) *Attorney, Agent, or Firm* — Jefferson IP Law, LLP

(57) ABSTRACT

A method and an apparatus for measuring performance of an electronic device are provided. The apparatus includes an electromagnetic wave measuring device for measuring an actual level of an electromagnetic wave of an electronic device, and an analysis controller for applying a previously stored level change value to the actual level of the electromagnetic wave to compute a measured level of the electromagnetic wave. The method and the apparatus for measuring performance of an electronic device can easily measure an electromagnetic wave level of the electronic device without using a device suggested by an international standard.

20 Claims, 8 Drawing Sheets

METHOD AND APPARATUS FOR MEASURING PERFORMANCE OF ELECTRONIC DEVICE

PRIORITY

This application claims the benefit under 35 U.S.C. §119 (a) of a Korean patent application filed on Oct. 4, 2011 in the Korean Intellectual Property Office and assigned Serial No. 10-2011-0100801, the entire disclosure of which is hereby incorporated by reference.

BACKGROUND OF THE INVENTION

1. Field of the Invention

The present invention relates to a method and an apparatus for measuring performance of an electronic device. More particularly, the present invention relates to an apparatus for measuring Electro-Magnetic Compatibility (EMC) of an electronic device and a method thereof.

2. Description of the Related Art

An electronic device performs various functions, such as a call function, a message transmission/reception function, a wireless Internet function, and a navigation function. To do this, the electronic device is constructed with various electronic components. The electronic device provides power to one or more of the various electronic components to perform a desired function.

When the electronic device provides power to the one or more of the various electronic components, a Radiated Emission (RE) may occur from the electronic components. The RE may act as Electro Magnetic Interference (EMI), which may exert a harmful influence upon human health. The electronic device may resist RE according to Electro Magnetic Susceptibility (EMS) implemented by the various electronic components.

Due to this, to suppress RE for the electronic device, EMC indicating performance with respect to EMI caused by the electronic device and EMS implemented by the electronic device has been controlled. That is, the EMC of the electronic device should satisfy an international standard.

However, a device for measuring the EMC of the electronic device takes up a large installation space and has a high facility maintenance cost. Furthermore, it takes a long time to measure the EMC of the electronic device by the foregoing device.

Therefore, a need exists for a method for measuring performance of an electronic device that reduces an installation space of a device for measuring EMC of the electronic device, a facility maintenance cost and an amount of time taken to measure EMC of the electronic device, and an apparatus therefore.

SUMMARY OF THE INVENTION

Aspects of the present invention are to address at least the above-mentioned problems and/or disadvantages and to provide at least the advantages described below. Accordingly, an aspect of the present invention is to provide a method for measuring performance of an electronic device which reduces an installation space of a device for measuring Electro-Magnetic Compatibility (EMC) of the electronic device and a facility maintenance cost, and an apparatus therefore.

Another aspect of the present invention is to provide a method for measuring performance of an electronic device that reduces an amount of time taken to measure EMC of an electronic device and an apparatus thereof.

In accordance with an aspect of the present invention, a method of measuring performance of an electronic device is provided. The method includes obtaining a relationship equation between an electromagnetic level measured by a first measuring device and an electromagnetic level measured by a second measuring device, measuring an electromagnetic wave level of a measurement target electronic device by the second measuring device, and obtaining an electromagnetic wave level of the measurement target electronic device to be measured by the first measuring device based on the measured electromagnetic wave level and the relationship equation.

In accordance with another aspect of the present invention, a method of measuring performance of an electronic device by a measuring device is provided. The method includes measuring a first electromagnetic wave level radiated from the electronic device, and obtaining an electromagnetic wave level of the electronic device measured by another measuring device based on a relationship equation obtained based on the first measured electromagnetic wave level and electromagnetic wave levels previously measured by the measuring device and the other measuring device.

In accordance with still another aspect of the present invention, an apparatus of measuring performance of an electronic device is provided. The apparatus includes a measuring unit measuring a first electromagnetic wave level radiated from the electronic device, and a controller obtaining an electromagnetic wave level of the electronic device measured by another measuring device based on a relationship equation obtained based on the first measured electromagnetic wave level and electromagnetic wave levels previously measured by the measuring device and the other measuring device.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description in conjunction with the accompanying drawings, in which.

Throughout the drawings, like reference numerals will be understood to refer to like parts, components, and structures.

DETAILED DESCRIPTION OF EXEMPLARY EMBODIMENTS

Figure 1:
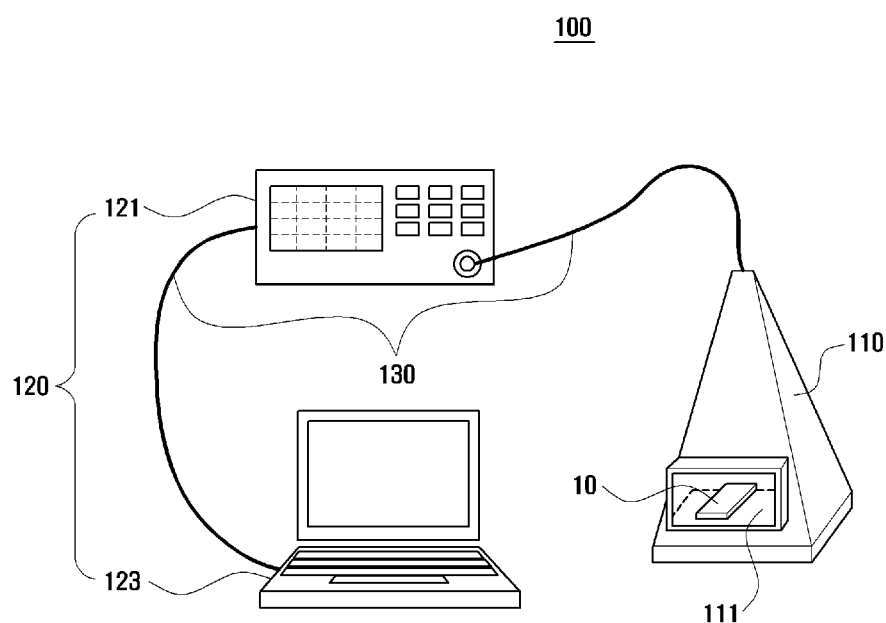
FIG. 1 is a diagram illustrating an apparatus for measuring performance of an electronic device according to an exemplary embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, the term "reference level of the electromagnetic wave" refers to an electromagnetic wave level of an electronic device measured in a suggested way by an international standard. For example, the reference level of the electromagnetic wave is measured by a device used to determine Electro-Magnetic Compatibility (EMC) of the electronic device with respect to an international standard. For example, the international standard is determined as a result of a measurement through a chamber. Accordingly, the electromagnetic reference level is measurement by the chamber and the measured electromagnetic reference level may be compared with the international standard. It takes about 1 hour to measure an electromagnetic wave reference level through a chamber. In this case, the chamber has a structure in which a receiving antenna and a rotating table are mounted in a hexahedral interior. Here, the receiving antenna is mounted on the rotating table to be spaced apart in a vertical direction from the ground, and to be spaced apart in a horizontal direction from the electronic device. Further, when the receiving antenna receives an electromagnetic wave of the electronic device, the receiving antenna is rotated according to rotation of the rotating table to receive a vertical component and a horizontal component of the electromagnetic wave from the electronic device, respectively. Through this, the reference level of the electromagnetic wave of the electronic device, that is, a vertical reference level and a horizontal reference level are measured, respectively.

According to the exemplary embodiment of the present invention, the reference level of the electromagnetic wave may be determined based on a radiated emission level of the electronic device measured from the EMC chamber. According to the exemplary embodiment of the present invention, the EMC chamber may refer to a reference measuring device. The reference level of the electromagnetic wave may refer to a reference electromagnetic wave distribution.

As used herein, the term "comparison level of the electromagnetic wave" refers to an electromagnetic level of the electronic device for comparing with the electromagnetic wave level. In this case, the comparison level of the electromagnetic wave is determined by an electronic device having the same electromagnetic level. Further, the comparison level of the electromagnetic wave may be measured by the same device as, or a device different from, the electromagnetic reference level. For example, the comparison level of the electromagnetic wave may be measured by a Transverse Electro Magnetic (TEM) Cell or a Radio Frequency (RF) shield box. In the TEM cell and the RF shield box, an electronic device installed in a shield space receives an electromagnetic wave. It may take about 60 seconds to measure the comparison level of the electromagnetic wave by the TEM cell or the RF shield box. Moreover, the TEM cell or the RF shield box receives the vertical component and the horizontal component from the electromagnetic wave of the electronic device according to a location and a position of the electronic device. Through this, the reference level of the electromagnetic wave, that is, a vertical comparison level and a horizontal comparison level may be measured, respectively.

According to the exemplary embodiment of the present invention, the TEM cell or the RF shield box may be configured by a device smaller than the EMC chamber. The comparison level of the electromagnetic wave may be determined based on an electromagnetic emission level of an electronic device measured from the TEM cell or the RF shield box. According to the exemplary embodiment of the present invention, the TEM cell or the RF shield box may refer to an actual measuring device. The comparison level of the electromagnetic wave may refer to an actual electromagnetic wave distribution.

As used herein, the term "actual level of electromagnetic wave" refers to an electromagnetic level for actual confirmation actually measured in an electronic device. In this case, the actual level of the electromagnetic wave is determined by the reference level of an electromagnetic wave, the comparison level of the electromagnetic wave, and the same or different type of an electronic device. Further, the actual level of the electromagnetic wave is measured by the electromagnetic wave comparison and the same device. For instance, the actual level of the electromagnetic wave may be measured using the TEM cell or the RF shield box. It may take about 60 seconds to measure the actual level of the electromagnetic wave through the TEM cell or the RF shield box. Further, the TEM cell or the RF shield box receives a vertical component and a horizontal component from an electromagnetic wave of the electronic device according to a location and a position of the electronic device, respectively. Through this, the actual electromagnetic level of the electronic device, that is, an actual vertical level and an actual horizontal level are measured, respectively.

According to the exemplary embodiment of the present invention, the actual level of the electromagnetic wave may be determined based on a measured actual level of the electromagnetic wave by measuring an electromagnetic emission level to be confirmed from the TEM cell or the RF shield box. The actual level of the electromagnetic wave to be confirmed and radiated from the electronic device may be different from a result value measured from an EMC chamber.

As used herein, the term "measured level of the electromagnetic wave" refers to an electromagnetic level of an electronic device for substantially comparing an international standard. For example, the measured level of the electromagnetic wave is not measured by the electronic device but is computed from the actual level of the electromagnetic wave. In this case, the measured level of the electromagnetic wave is expected to be the reference level of the electromagnetic wave measured by the same device. For example, the measured level of the electromagnetic wave is expected as being measured using the chamber and is compared with the international standard. Here, the measured level of the electromagnetic wave is acquired in the range of about 1 minute to 2 minutes and indicates a result similar to a value measured for about 1 hour. This is used to determine whether the measured level of the electromagnetic wave satisfies the international standard.

According to the exemplary embodiment of the present invention, the measured level of the electromagnetic wave may be obtained by applying an equation determined based on a difference between the reference level of the electromagnetic wave and the comparison level of the electromagnetic wave to the actual level of the electromagnetic level. As described above, various EMIs of the electronic device may be measured within a short time by obtaining the measured level of the electromagnetic wave from the actual level of the electromagnetic wave. A device for measuring an electromagnetic wave level may include a measuring unit capable of an electromagnetic wave level radiated from the electronic device. The measuring device may include a controller capable of obtaining an electromagnetic wave level to be measured by another measuring device based on at least one of the measured level of the electromagnetic wave and a value input by a user. The measuring device may include an input unit capable of receiving the measured level of the electromagnetic wave from a user.

FIG. 1 is a diagram illustrating an apparatus for measuring performance of an electronic device according to an exemplary embodiment of the present invention.

Figure 2:
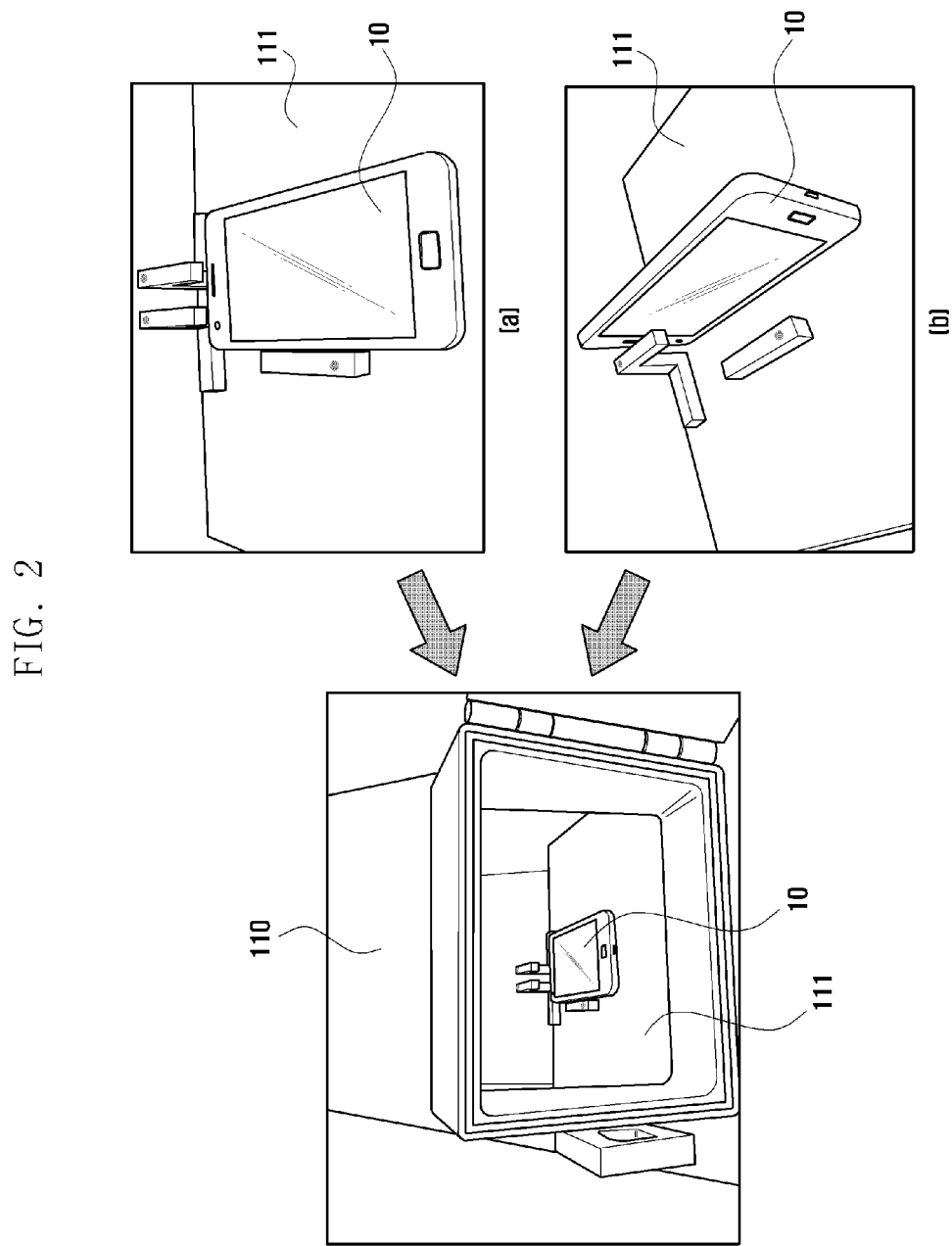
FIG. 2 is a diagram illustrating the electromagnetic wave measuring device shown in FIG. 1.

FIG. 2 is a diagram illustrating the electromagnetic wave measuring device shown in FIG. 1.

Referring to FIGS. 1 and 2, the apparatus 100 for measuring performance of an electronic device 10 according to an exemplary embodiment of the present invention includes an electromagnetic wave measuring device 110, an analysis controller 120, and a connection cable 130.

The electromagnetic wave measuring device 110 receives an electromagnetic wave of the electronic device 10. The electromagnetic wave measuring device 110 may be a TEM cell or an RF shield box. In this case, the electromagnetic wave measuring device 110 includes a fixing pad 111. As shown in FIG. 2, the fixing pad 111 is mounted inside the electromagnetic wave measuring device 110 and fixes a location of a position of the electronic device 10. As shown in orientation (a), the electronic device 10 is horizontally fixed to the fixing pad 111 so that the electromagnetic wave measuring device 110 may receive a vertical component of the electromagnetic wave. Further, as shown in orientation (b), the electronic device 10 is vertically fixed to the fixing pad 111 so that the electromagnetic wave measuring device 110 may receive a horizontal component of the electromagnetic wave. Here, a compatibility determiner 123 may operate in a state in which a Resolution Bandwidth and attenuation are adjusted to 5 MHz or less.

The analysis controller 120 determines an electromagnetic level of the electronic device 10 according to an electromagnetic wave received strength from the electromagnetic wave measuring device 110 to determine compatibility of the electronic device. The analysis controller 120 includes an electromagnetic wave analyzer 121 and a compatibility determiner 123.

The electromagnetic wave analyzer 121 analyzes an electromagnetic wave received from the electromagnetic wave measuring device 110 to determine an electromagnetic wave level of the electronic device 10 according to an electromagnetic wave received strength. In this case, the electromagnetic wave analyzer 121 measures a peak of an electromagnetic wave received strength at a predetermined time interval to determine an electromagnetic level. Here, the electromagnetic wave analyzer 121 may determine an actual level of the electromagnetic wave at a time interval corresponding to at least 1 second. The electromagnetic wave analyzer 121 may be a spectrum analyzer or an oscilloscope.

The compatibility determiner 123 analyzes an electromagnetic wave level of the electronic device 10 to determine EMC of the electronic device 10. For example, the compatibility determiner 123 determines an extent of Radiated Emission (RE) of the electronic device 10. The compatibility determiner 123 may be a Personal Computer (PC). The electromagnetic wave analyzer 121 may comprise an oscilloscope. The compatibility determiner 123 converts an electromagnetic level determined by the electromagnetic wave analyzer 121 into a frequency domain using a Fast Fourier Transform (FFT) function and analyzes the frequency domain. In this case, the compatibility determiner 123 may determine a comparison level of the electromagnetic wave and an actual level of the electromagnetic wave of the electronic device 10. The compatibility determiner 123 may include software for computing a measured level of the electromagnetic wave from the actual level of the electromagnetic wave. For example, the compatibility determiner 123 may operate the software to compute and display a measured level of the electromagnetic wave from the actual electromagnetic level of the electronic device 10.

For example, the compatibility determiner 123 may previously store only a reference level of the electromagnetic wave. The compatibility determiner 123 may determine a comparison level of the electromagnetic wave and compare the comparison level of the electromagnetic wave with a reference level of the electromagnetic wave. In this case, the compatibility determiner 123 may compute a level change value (e.g., transfer function) as a difference between the reference level of the electromagnetic wave and the comparison level of the electromagnetic wave and store the level change value. The compatibility determiner 123 may determine an actual level of the electromagnetic wave and apply the level change value to the actual level of the electromagnetic wave to compute an electromagnetic wave measured level. Further, the compatibility determiner 123 may determine whether the measured level of the electromagnetic wave satisfies the international standard.

The compatibility determiner 123 may store the level change value in advance. The compatibility determiner 123 may determine the actual level of the electromagnetic wave. The compatibility determiner 123 may apply the level change value to the actual level of the electromagnetic wave to compute a measured level of the electromagnetic wave. Furthermore, the compatibility determiner 123 may determine whether the measured level of the electromagnetic wave satisfies the international standard.

The connection cable 130 connects the analysis controller 120 to the electromagnetic wave measuring device 110. The connection cable 130 connects a compatibility determiner 123 to the electromagnetic analyzer 121 in the analysis controller 120. The connection cable 130 may be a General Purpose Interface Bus (GPIB).

Figure 3:
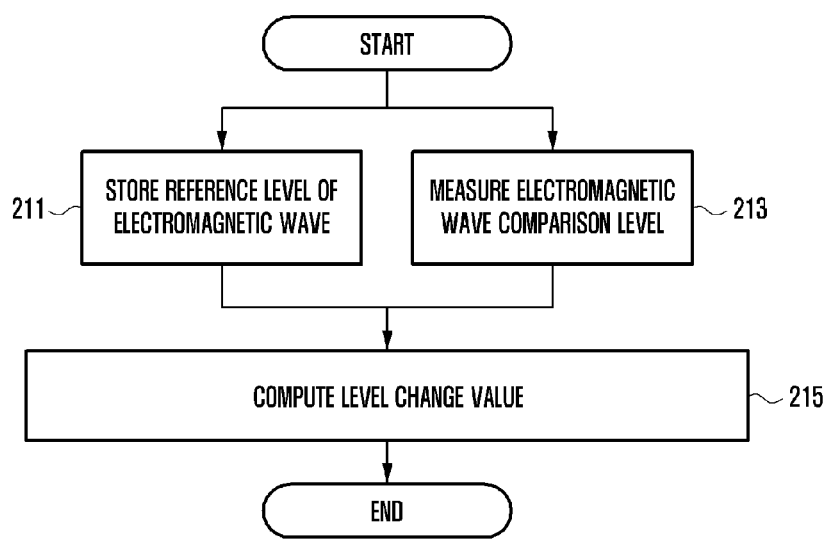
FIG. 3 is a flowchart illustrating a method of computing a level variation value according to an exemplary embodiment of the present invention.

FIG. 3 is a flowchart illustrating a method of computing a level variation value according to an exemplary embodiment of the present invention.

Figure 4A:
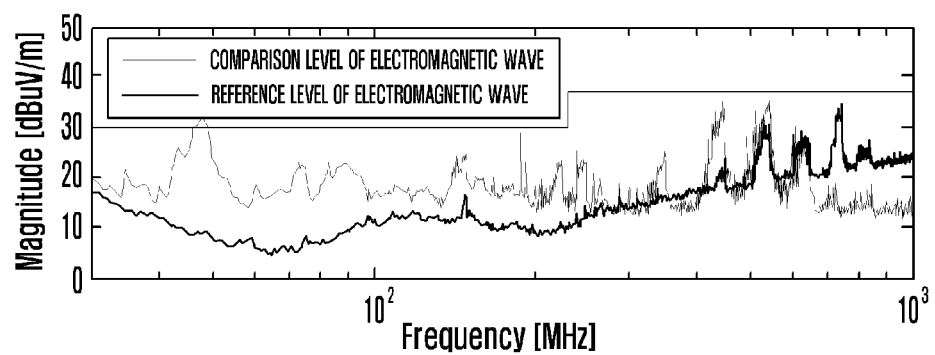
FIGS. 4A and 4B are graphs for illustrating FIG. 3.
Figure 4B:
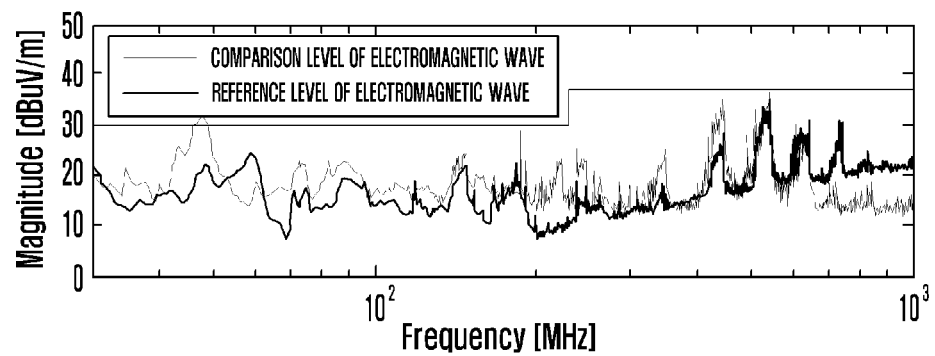

FIGS. 4A and 4B are graphs for illustrating FIG. 3.

Referring to FIG. 3, the apparatus 100 for measuring performance of an electronic device stores a reference level of the electromagnetic wave in step 211. The apparatus 100 for measuring performance of the electronic device may store a reference level of the electromagnetic wave as a value input by a user. In this case, the apparatus 100 for measuring performance of an electronic device stores a horizontal reference level and a vertical reference level. The apparatus 100 for measuring performance of an electronic device measures an electromagnetic wave comparison level in step 213. In this case, the apparatus 100 for measuring performance of an electronic device stores a horizontal comparison level and a vertical comparison level, respectively.

After that, the apparatus 100 for measuring performance of an electronic device computes a level change value as a difference between the electromagnetic wave reference value and the comparison level of the electromagnetic wave in step 215. In this case, the apparatus 100 for measuring performance of an electronic device stores the level change value. For example, as shown in FIG. 4A, there is a difference between the horizontal reference level and the horizontal comparison level, and the apparatus 100 for measuring performance of an electronic device computes and stores a horizontal change value as a difference between the horizontal reference level and the horizontal comparison level. There is a difference of greater than about 20 dB between the horizontal reference level and the horizontal comparison level. As shown in FIG. 4B, there is a difference between a vertical reference level and a vertical comparison level. The apparatus 100 for measuring performance of an electronic device computes and stores a vertical change value as a difference between the vertical reference level and the vertical comparison level. There is a difference of greater than about 20 dB between the vertical reference level and the vertical comparison level.

Through this, the apparatus 100 for measuring performance of an electronic device acquires background noise generated by a device measuring the reference level of the electromagnetic wave. For example, the level change value may be acquired as the background noise corresponding to the electromagnetic reference level. In this case, the level change value is measured by a device having a reference level of the electromagnetic wave being the same as the international standard, and may be expected to be a background noise corresponding to the international standard.

Although the apparatus 100 for measuring performance of an electronic device measures a comparison level of the electromagnetic wave to compute the level change value, the exemplary embodiment of the present invention is not limited thereto. For example, the apparatus 100 for measuring performance of an electronic device stores the level change value as a value input by the user so that the present exemplary embodiment may be implemented. Although the apparatus 100 for measuring performance of an electronic device computes the level change value as a difference between a reference level of the electromagnetic wave corresponding to a value input by the user and the comparison level of the electromagnetic wave, the present exemplary embodiment may be implemented.

Figure 5:
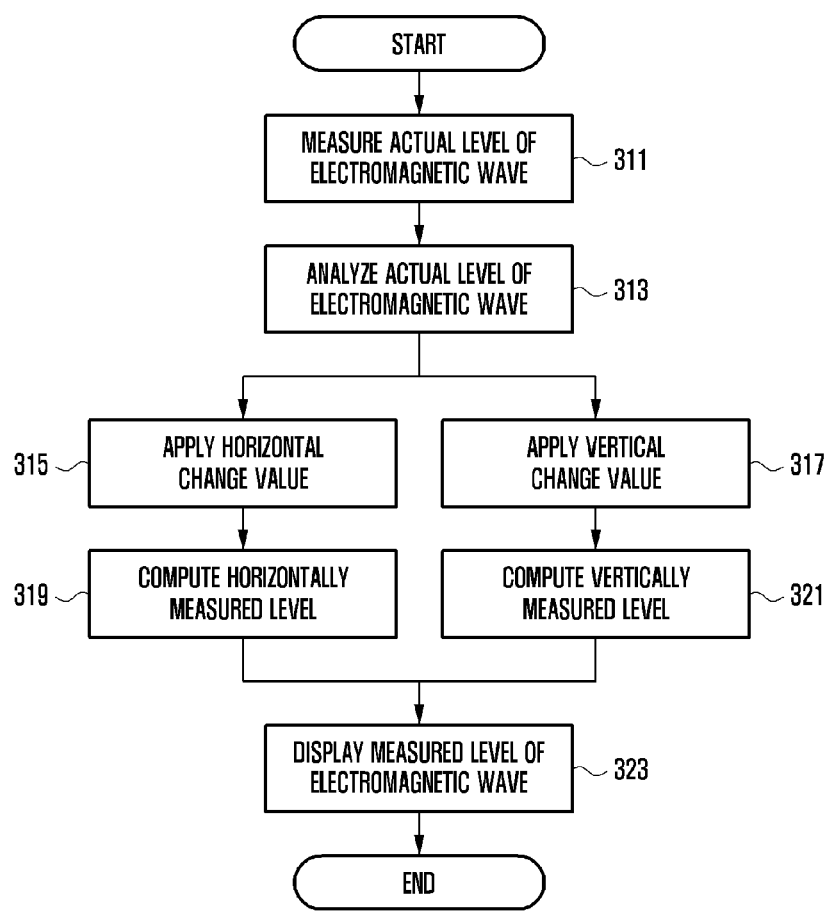
FIG. 5 is a flowchart illustrating a method of measuring performance of an electronic device according to an exemplary embodiment of the present invention.
Figure 6A:
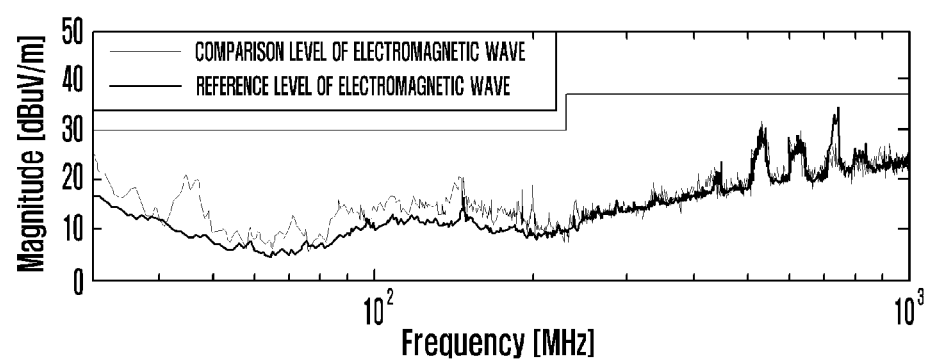
FIGS. 6A, 6B and 7 are graphs for illustrating FIG. 5.
Figure 6B:
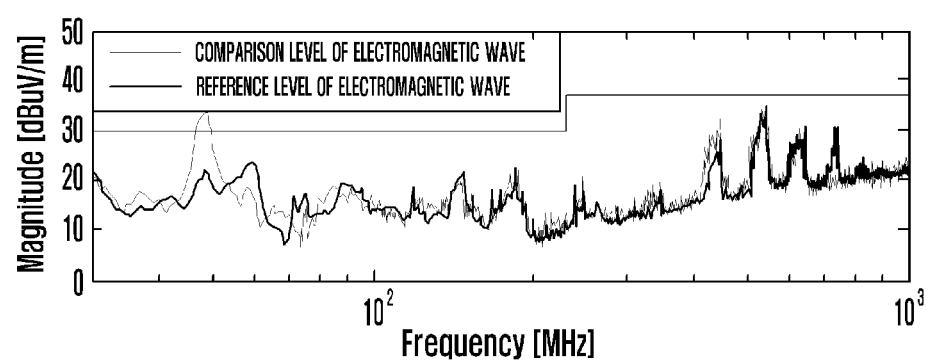
Figure 7:
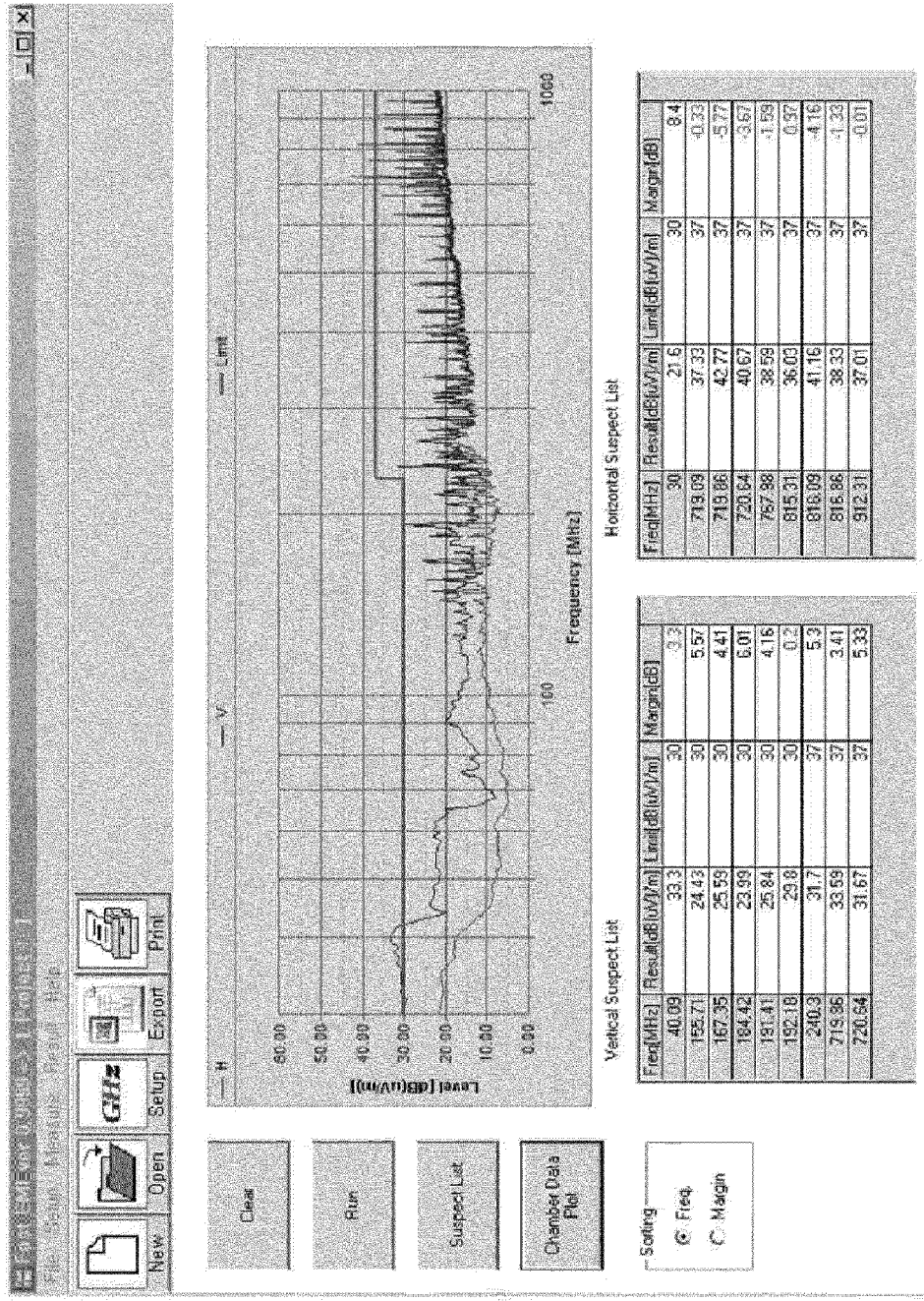

FIG. 5 is a flowchart illustrating a method of measuring performance of an electronic device according to an exemplary embodiment of the present invention. FIGS. 6 and 7 are graphs for illustrating FIG. 5.

Referring to FIG. 5, an apparatus 100 for measuring performance of an electronic device measures an actual level of an electromagnetic wave in step 311. For example, in the apparatus 100 for measuring performance of an electronic device, an electromagnetic wave measuring device 110 receives an electromagnetic wave from an electronic device mounted in the fixing pad 111. In this case, the electronic device 100 may be vertically or horizontally fixed.

Next, the apparatus 100 for measuring performance of the electronic device 10 analyzes the actual level of the electromagnetic wave in step 313. For example, in the apparatus 100 for measuring performance of the electronic device 10, an electromagnetic wave analyzer 121 analyzes the electromagnetic wave received by the electromagnetic wave measuring device 110 to determine the actual level of the electromagnetic wave of the electronic device 10 according to a received strength of the electromagnetic wave. In this case, the electromagnetic wave analyzer 121 measures a peak of a received strength of the electromagnetic wave at a predetermined time interval to determine an actual level of the electromagnetic wave. Here, the electromagnetic wave analyzer 121 determines an actual horizontal level or an actual vertical level. For example, when the electronic device 10 is vertically fixed to the fixing pad 111, the electromagnetic wave analyzer 121 may determine the actual horizontal level of the electronic device 10. When the electronic device 10 is horizontally fixed to the fixing pad 111, the electromagnetic analyzer 121 may determine an actual vertical level of the electronic device 10.

Next, the apparatus 100 for measuring performance of the electronic device 10 may apply a previously stored horizontal change value in step 315 to the actual horizontal level to compute a horizontally measured level in step 319. Here, the horizontal change value is applied as an offset for computing the horizontally measured level based on the actual horizontal level. In this case, as shown in FIG. 6A, the apparatus 100 for measuring performance of the electronic device 10 may expect the horizontally measured level to be a value measured by a device measuring the horizontal reference level. Here, there is a difference of less than about 5 dB between a value measured by a device in a horizontal measured level and a value measured by a device in a horizontal reference level.

The apparatus 100 for measuring performance of the electronic device 10 applies a previously stored vertical change value to an actual vertical level in step 317 to compute a vertically measured level in step 321. Here, the vertical change value is applied as an offset for computing the vertically measured level based on the actual vertical level. In this case, as shown in FIG. 6B, the apparatus 100 for measuring performance of the electronic device 10 may expect the vertically measured level to be a value measured by a device measuring the vertical reference level. Here, there is a difference of less than about 5 dB between a value measured by a device in a vertical measured level and a value measured by a device in a vertical reference level.

Subsequently, the apparatus 100 for measuring performance of the electronic device 10 displays a measured level of the electromagnetic wave in step 323. For example, in the apparatus 100 for measuring performance of the electronic device 10, a compatibility determiner 123 operates software to display a horizontally measured level and a vertically measured level as shown in FIG. 7. In this case, the compatibility determiner 123 may display the measured level of the electromagnetic wave together with the international standard so that the user of the apparatus 100 may determine whether the measured level of the electromagnetic wave satisfies the international standard.

Figure 8:
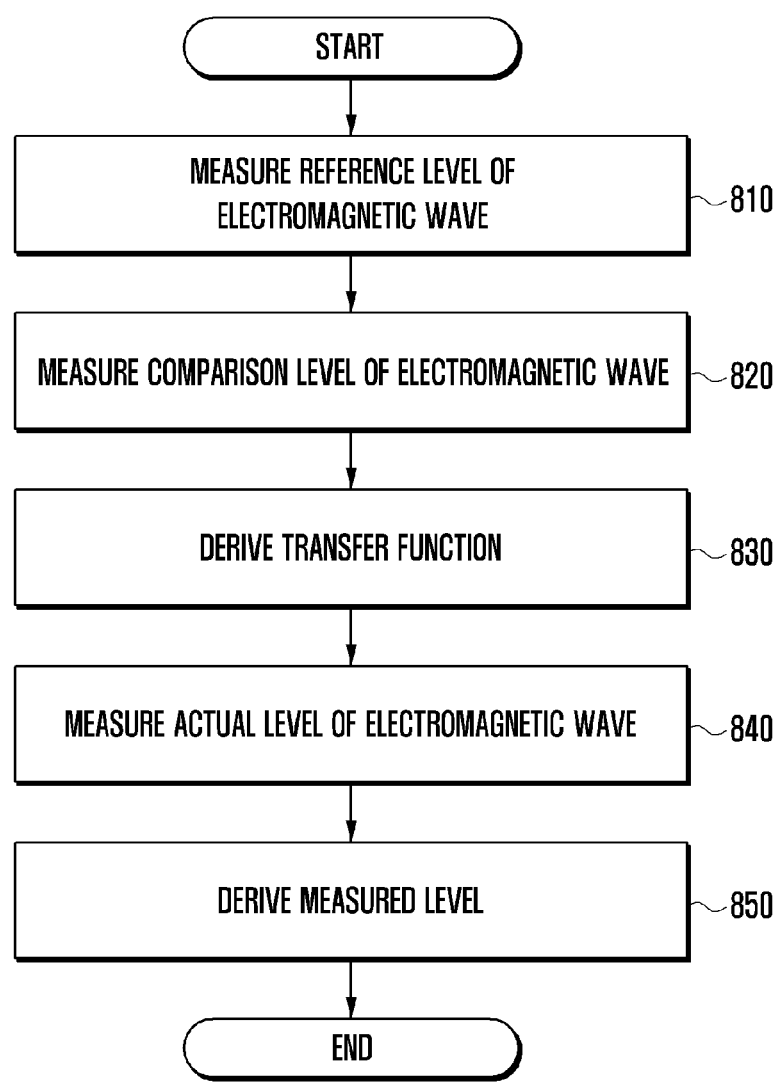
FIG. 8 is a flowchart illustrating a method of measuring performance of an electronic device according to an exemplary embodiment of the present invention.

FIG. 8 is a flowchart illustrating a method of measuring performance of an electronic device according to an exemplary embodiment of the present invention.

Referring to FIG. 8, an apparatus 100 for measuring performance of an electronic device may measure a reference level of an electromagnetic wave in step 810. In detail, the step of measuring the reference level of the electromagnetic wave may include measuring a background noise in a state in which the electronic device is inserted into the EMC chamber and measuring an electromagnetic wave by frequencies radiated from the reference signal generator in a state in which the reference signal generator is provided in the EMC chamber.

The apparatus 100 may measure a comparison level of the electromagnetic wave in step 820. In detail, the step of measuring the comparison level of the electromagnetic wave may include measuring the background noise in a state in which the electronic device is not provided inside the TEM cell or the RF shield box and measuring the electromagnetic wave by frequencies radiated from the reference signal generator in a state in which the electronic device is provided inside the TEM cell or the RF shield box.

The apparatus derives a transfer function based on the measured reference level of the electromagnetic wave and the measured comparison level of the electromagnetic wave in step 830. The transfer function is derived by a relationship between the reference level and the comparison level of the electromagnetic wave. When applying the transfer function to an electromagnetic wave level of the electronic device measured in the TEM cell or the RF shield box, the electromagnetic wave level of the electronic device measured in the EMC chamber may be construed. In more detail, the transfer function may be configured in the form of a weight function that compares the measured comparison level of the electromagnetic wave with the measured reference level of the electromagnetic wave by frequencies to reflect a difference according to a frequency band. Accordingly, even when the reference level of the electromagnetic wave and the comparison level of the electromagnetic wave according to the measured state represent different characteristics according to the frequency band, the transfer function is applied to exactly expect an electromagnetic level radiated from the electronic device. According to the exemplary embodiment of the present invention, a high weight function value is applicable to a frequency band having a great difference between the comparison level of the electromagnetic wave and the reference level of the electromagnetic wave, a low weight function value is applicable to a frequency band having a small difference therebetween.

The apparatus 100 may measure an actual level of the electromagnetic wave in step 840. According to the exemplary embodiment of the present invention, the actual level of the electromagnetic wave may be an electromagnetic wave level measured from the electronic device installed inside the TEM cell or the RF shield box.

The apparatus 100 may obtain the measured level of the electromagnetic wave based on the transfer function derived at step 830 and the actual level of the electromagnetic wave measured at step 840 in step 850. The transfer function is applied to the actual level of the electromagnetic wave to derive an electromagnetic wave level measured in a state in which the electronic device in which the measurement is performed is installed in the chamber. The present exemplary embodiment may measure an electromagnetic wave level of the electronic device within a short time using a small measuring device by measuring the electromagnetic wave of the electronic device using the foregoing transfer function.

According to the present exemplary embodiment, since a difference between an electromagnetic wave level of the electronic device 10 measured by a device suggested based on the international standard and an electromagnetic wave level of the electronic device 10 measured by the apparatus 100 for measuring performance is reduced to 5 dB, compatibility of the foregoing devices is improved. Owing to this, although the device suggested based on the international standard is not used, the apparatus 100 for measuring performance of the electronic device 10 may easily measure the electromagnetic wave level of the electronic device 10. Accordingly, an installation space for the apparatus 100 for measuring performance of the electronic device 10 and a facility maintenance cost can be reduced. Also, an amount of time taken to measure EMC of the electronic device 100 by the apparatus 100 for measuring performance of the electronic device 10 can be reduced. For example, the apparatus for measuring performance of the electronic device 10 can efficiently measure EMC of the electronic device 10.

The method and the apparatus for measuring performance of an electronic device according to the present invention can easily measure an electromagnetic wave level of the electronic device without using a device suggested from an international standard. Owing to this, an installation space for the apparatus for measuring performance of the electronic device and a facility maintenance cost can be reduced. An amount of time taken to measure EMC of the electronic device can be reduced in the apparatus for measuring performance of the electronic device. Therefore, EMC of the electronic device can be efficiently measured in the apparatus for measuring performance of the electronic device.

Although the exemplary embodiment of the present invention has illustrated a method and an apparatus for measuring an electromagnetic wave, it will be apparent that a technical characteristic disclosing the exemplary embodiment of the present invention may be used in another exemplary embodiment of the present invention to easily measure a physical numeral such as heat, vibration, and light which is measured at the outside through a method disclosed in the exemplary embodiment of the present invention.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method of measuring performance of an electronic device, the method comprising:
    obtaining a relationship equation between an electromagnetic level measured by a first measuring device and an electromagnetic level measured by a second measuring device;
    measuring a first electromagnetic wave level of a measurement target electronic device by the second measuring device; and
    obtaining a second electromagnetic wave level of the measurement target electronic device based on the measured first electromagnetic wave level and the relationship equation.

2. The method of claim 1, wherein the obtaining of the relationship equation comprises measuring a background noise by the first measuring device and the second measuring device.

3. The method of claim 2, wherein the obtaining of the relationship equation comprises:
    measuring an electromagnetic wave level radiated from a reference signal generator by the first measuring device and the second measuring device; and
    comparing an electromagnetic level of the reference signal generator measured by the second measuring device with an electromagnetic level of the reference signal generator measured by the first measuring device.

4. The method of claim 3, wherein the comparing of the electromagnetic level comprises comparing horizontal and vertical electromagnetic levels of the reference signal generator measured by the second measuring device with horizontal and vertical electromagnetic levels of the reference signal generator measured by the first measuring device, respectively.

5. The method of claim 3, wherein the comparing of the electromagnetic level comprises comparing the electromagnetic level of the reference signal generator measured by the second measuring device with the electromagnetic level of the reference signal generator measured by the first measuring device by frequency bands to obtain a weight function by frequencies based on the comparison result by the frequency bands.

6. The method of claim 1, wherein the obtaining of the relationship equation comprises receiving an electromagnetic level previously measured by the first measuring device and an electromagnetic level previously measured by the second measuring device.

7. A method of measuring performance of an electronic device by a measuring device, the method comprising:
   measuring a first electromagnetic wave level radiated from the electronic device; and
   obtaining a second electromagnetic wave level of the electronic device based on a relationship equation obtained based on the first measured electromagnetic wave level and electromagnetic wave levels previously measured by the measuring device and the other measuring device.

8. The method of claim 7, wherein the relationship equation is obtained based on a background noise measured by the measuring device and the other measuring device.

9. The method of claim 8, wherein the relationship equation is obtained based on measuring an electromagnetic wave level radiated from a reference signal generator by the measuring device and the other measuring device, and comparing an electromagnetic level of the reference signal generator measured by the other measuring device with an electromagnetic level of the reference signal generator measured by the measuring device.

10. The method of claim 9, wherein the relationship equation compares horizontal and vertical electromagnetic levels of the reference signal generator measured by the other measuring device with horizontal and vertical electromagnetic levels of the reference signal generator measured by the measuring device, respectively.

11. The method of claim 9, wherein the relationship equation includes a weight function obtained by frequencies based on the comparison result by the frequency bands by comparing the electromagnetic level of the reference signal generator measured by the other measuring device with the electromagnetic level of the reference signal generator measured by the measuring device by frequency bands.

12. The method of claim 7, wherein the relationship equation is obtained based on an input value generated by receiving an electromagnetic level previously measured by the measuring device and an electromagnetic level previously measured by the other measuring device.

13. A measuring device for measuring performance of an electronic device, the measuring device comprising:
   a measuring unit for measuring a first electromagnetic wave level radiated from the electronic device; and
   a controller for obtaining a second electromagnetic wave level of the electronic device based on a relationship equation obtained based on the first measured electromagnetic wave level and electromagnetic wave levels previously measured by the measuring device and the other measuring device.

14. The measuring device of claim 13, wherein the controller obtains the relationship equation based on a background noise measured by the first measuring device and the other measuring device.

15. The measuring device of claim 14, wherein the controller obtains the relationship equation based on measuring an electromagnetic wave level radiated from a reference signal generator by the measuring device and the other measuring device, and comparing an electromagnetic level of the reference signal generator measured by the other measuring device with an electromagnetic level of the reference signal generator measured by the measuring device.

16. The measuring device of claim 14, wherein the controller obtains the relationship equation based on comparing horizontal and vertical electromagnetic levels of the reference signal generator measured by the other measuring device with horizontal and vertical electromagnetic levels of the reference signal generator measured by the measuring device, respectively.

17. The measuring device of claim 14, wherein the controller obtains the relationship equation including a weight function obtained by frequencies based on the comparison result by the frequency bands by comparing the electromagnetic level of the reference signal generator measured by the other measuring device with the electromagnetic level of the reference signal generator measured by the measuring device by frequency bands.

18. The measuring device of claim 13, further comprising an input unit receiving an electromagnetic level previously measured by the measuring device and an electromagnetic level previously measured by the other measuring device, and
   wherein the controller obtains the relationship equation based on the received electromagnetic level.

19. A measuring device for measuring performance of a measurement target electronic device, the method comprising:
   a measuring unit for measuring a first electromagnetic wave level of the measurement target electronic device by the measuring device; and
   a controller for obtaining a relationship equation between an electromagnetic level measured by the measuring device and an electromagnetic level measured by another measuring device, and for obtaining a second electromagnetic wave level of the measurement target electronic device based on the measured first electromagnetic wave level and the relationship equation.

20. The method of claim 19, wherein the controller measures a background noise by the measuring device and the other measuring device for obtaining the relationship equation.

* * * * *